United States Patent
Lin et al.

(10) Patent No.: US 11,987,883 B2
(45) Date of Patent: *May 21, 2024

(54) POWDER ATOMIC LAYER DEPOSITION APPARATUS FOR BLOWING POWDERS

(71) Applicant: SKY TECH INC., Hsinchu County (TW)

(72) Inventors: Jing-Cheng Lin, Hsinchu County (TW); Jung-Hua Chang, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 261 days.

This patent is subject to a terminal disclaimer.

(21) Appl. No.: 17/334,775

(22) Filed: May 30, 2021

(65) Prior Publication Data

US 2022/0136103 A1    May 5, 2022

(30) Foreign Application Priority Data

Nov. 2, 2020 (TW) .................................. 109138136

(51) Int. Cl.
*C23C 16/455* (2006.01)
*C23C 16/44* (2006.01)
*C23C 16/54* (2006.01)

(52) U.S. Cl.
CPC .... *C23C 16/45544* (2013.01); *C23C 16/4412* (2013.01); *C23C 16/4417* (2013.01); *C23C 16/54* (2013.01)

(58) Field of Classification Search
None
See application file for complete search history.

(56) References Cited

U.S. PATENT DOCUMENTS

| | | | | |
|---|---|---|---|---|
| 5,003,919 | A * | 4/1991 | Yamamoto | G11B 5/70605 118/716 |
| 11,739,423 | B2 * | 8/2023 | Lin | C23C 16/4417 118/716 |
| 11,767,591 | B2 * | 9/2023 | Lin | C23C 16/4417 118/716 |
| 2013/0059073 | A1 * | 3/2013 | Jiang | C04B 35/62222 118/715 |
| 2015/0125599 | A1 * | 5/2015 | Lindfors | C23C 16/45555 118/716 |
| 2016/0369396 | A1 * | 12/2016 | Sammelselg | C23C 16/45555 |
| 2017/0327948 | A1 * | 11/2017 | Dadheech | C23C 16/4417 |

(Continued)

*Primary Examiner* — Karla A Moore
(74) *Attorney, Agent, or Firm* — Chun-Ming Shih; HDLS IPR SERVICES

(57) ABSTRACT

A powder atomic layer deposition apparatus for blowing powders is disclosed. The powder atomic layer deposition apparatus includes a vacuum chamber, a shaft sealing device, and a driving unit. The driving unit drives the vacuum chamber to rotate through the shaft sealing device. The shaft sealing device includes an outer tube and an inner tube, wherein the inner tube is arranged in an accommodating space of the outer tube. At least one air extraction line and at least one air intake line are located in the inner tube, wherein the air intake line extends from the inner tube into a reaction space within the vacuum chamber, and is used to transport the a non-reactive gas to the reaction space to blow the powders around in the reaction space.

10 Claims, 9 Drawing Sheets

(56) References Cited

U.S. PATENT DOCUMENTS

| | | | |
|---|---|---|---|
| 2022/0106682 A1* | 4/2022 | Lin | C23C 16/4557 |
| 2022/0106684 A1* | 4/2022 | Lin | C23C 16/45574 |
| 2022/0162750 A1* | 5/2022 | Lin | C23C 16/4417 |
| 2022/0341036 A1* | 10/2022 | Lin | C23C 16/45525 |
| 2023/0120393 A1* | 4/2023 | Lin | C23C 16/4417 |
| | | | 118/715 |
| 2023/0295802 A1* | 9/2023 | Lin | C23C 16/4417 |
| | | | 118/722 |

* cited by examiner

POWDER ATOMIC LAYER DEPOSITION APPARATUS FOR BLOWING POWDERS

REFERENCE TO RELATED APPLICATIONS

This non-provisional application claims priority claim under 35 U.S.C. § 119(a) on Taiwan Patent Application No. 109138136 filed Nov. 2, 2020, the entire contents of which are incorporated herein by reference.

TECHNICAL FIELD

The present disclosure relates to a powder atomic layer deposition apparatus for blowing powders, more particularly, to a powder atomic layer deposition apparatus for blowing powders that has at least one air intake line extending from a shaft sealing device into a reaction space of a vacuum chamber, for transporting a non-reactive gas to the reaction space to blow powders around in the reaction space.

BACKGROUND

Nanoparticle is generally defined as a particle that is smaller than 100 nanometers in at least one dimension, and in comparison to macroscopic matter, nanoparticle is completely different in both physical and chemical properties. Broadly speaking, the physical property of macroscopic matter is unrelated to its size, but the same cannot be said for nanoparticle. Nanoparticles are now being studied for potential applications in biomedical, optical, and electronic fields.

Quantum dot is a semiconductor nanoparticle and the semiconductor material currently being studied includes materials in groups II~VI like ZnS, CdS, CdSe, etc, in which CdSe is the most promising. The size of Quantum dot is usually between 2 to 50 nanometers. Electron in the quantum dot absorbs energy after being irradiated by ultra-violet light and transitions from valence band to conductance band. When the stimulated electron returns to the valence band from the conductance band, it releases the energy by emission of light.

The energy gap of a quantum dot is associated to its size, wherein the larger the size of a quantum dot, the smaller the energy gap which in turn emits light with longer wavelength after radiation, and the smaller the size of a quantum dot, the larger the energy gap which in turn emits light with shorter wavelength after radiation. For example, a quantum dot of 5 to 6 nanometers emits orange or red light, whereas a quantum dot of 2 to 3 nanometers emits blue or green light; the light color is, of course, determined by the material composition of the quantum dot.

Light generated by light emitting diode (LED) that utilizes quantum dots is near continuous spectrum and has good color rendering, which are beneficial in improving the luminous quality of LED. In addition, the wavelength of the emitted light can be adjusted by changing the size of quantum dot. Therefore quantum dots have become a main focus in developing the next generation of light-emitting devices and displays.

Although quantum dots have the aforementioned advantages and properties, agglomeration of the quantum dots occurs easily during application or manufacturing process. Moreover, quantum dots have higher surface activities and are prone to react with air and water vapor, which are factors that shorten the life cycle of nanoparticles.

In particular, agglomeration occurs when the quantum dots are being manufactured as sealant for LED and thereby decreasing the optical performance of quantum dots. Further, after the quantum dots are made as the sealant of LED, it is still possible for surrounding oxygen or water vapor to penetrate through the sealant and come in contact with the surface of the quantum dots, thereby causing the quantum dots to be oxidized and affecting the efficacy or life cycle of the quantum dots and LED. The surface defects and dangling bonds of the quantum dots may also cause non-radiative recombination, which also affects the luminous efficiency of quantum dots.

Atomic layer deposition (ALD) is a process currently used by industries to form a thin film with nanometer thickness or a plurality of thin films, on the surface of the quantum dots to form a quantum well.

ALD process can form a thin film with a uniform thickness on a substrate with precision in controlling the thickness of the thin film, and so in theory ALD process could also be applicable to three-dimensional quantum dots. When the quantum dots sit on a support pedestal, contacts exist between adjacent quantum dots, and these contacts cannot be reached by precursor gas of ALD. Thus, thin films with uniform thickness cannot be formed on the surface of all nanoparticles.

SUMMARY

To solve the aforementioned issues, the present disclosure provides a powder atomic layer deposition apparatus for blowing powders that has at least one air intake line extending from a shaft sealing device into a reaction space of a vacuum chamber. The air intake line is used to transport a non-reactive gas to the reaction space for blowing powders in the reaction space around, so as to coat a thin film with a uniform thickness on the surface of each powder.

An object of the present disclosure is to provide a powder atomic layer deposition apparatus for blowing powders, mainly including a driving unit, a shaft sealing device, and a vacuum chamber, wherein the vacuum chamber has a columnar reaction space. The columnar reaction space has two bottom sides and at least one abutment side connected to the two bottom sides. An air intake line is disposed in the shaft sealing device and extends to the reaction space toward the abutment side of the reaction space, such that an outlet of the air intake line is close to powders in the lower half of the vacuum chamber, so as to enhance the blowing of powders by a non-reactive gas transported by the air intake line.

Moreover, when measuring the temperature of the powders with a temperature sensing unit, the powders in the reaction space may be blown around by the non-reactive gas transported by the air intake line, so the temperature sensing unit is able obtain an accurate reading on the powder temperature.

An object of the present disclosure is to provide a powder atomic layer deposition apparatus for blowing powders that mainly includes an air intake line extending from a shaft sealing device into a reaction space and forming an extension line in the reaction space. The extension line has an outlet and there is an included angle between a line of extension from the outlet driving unit and an abutment side of the reaction space. A non-reactive gas is output by the extension line toward a slanted downwardly direction of the reaction space for blowing powders around in the reaction space.

An object of the present disclosure is to provide a powder atomic layer deposition apparatus for blowing powders that includes an extension line passing through an inner tube or a filter unit in the inner tube and extending to a reaction space of a vacuum chamber. The extension line extends toward an abutment side of the reaction space, wherein an outlet of the extension line faces a shaft sealing device or a cover lid, for directing or blowing a non-reactive gas toward the shaft sealing device or the cover lid.

To achieve the aforementioned objects, the present disclosure provides a powder atomic layer deposition apparatus for blowing powders, which includes a vacuum chamber, a shaft sealing device, a driving unit, at least one air extraction line, and at least one air intake line. The vacuum chamber includes a reaction space for accommodating a plurality of powders. The shaft sealing device includes an outer tube and an inner tube, and the outer tube has an accommodating space for accommodating the inner tube. The driving unit is connected to the vacuum chamber via the shaft sealing device and drives the vacuum chamber to rotate through the shaft sealing device. The air extraction line is disposed in the inner tube and fluidly connected to the reaction space of the vacuum chamber for extracting a gas in the reaction space. The air intake line extends form the inner tube into the reaction space toward a surface of the reaction space for transporting a non-reactive gas to the reaction space, wherein the non-reactive gas is used for blowing the powders around in the reaction space.

Preferably, the vacuum chamber includes two bottom sides and an abutment side connected to the two bottom sides. The air intake line extends in a direction toward the abutment side of the reaction space.

Preferably, the air intake line includes at least one non-reactive gas line extending from the inner tube into the reaction space toward the abutment side of the reaction space, for transporting the non-reactive gas to the reaction space of the vacuum chamber so as to blow the powders around in the reaction space with the non-reactive gas.

Preferably, the non-reactive gas line includes an extension line disposed in the reaction space and extending in a direction toward the abutment side of the reaction space.

Preferably, the extension line has an outlet facing the shaft sealing device. The non-reactive gas output from the outlet blows the powders around in the reaction space.

Preferably, the vacuum chamber includes a cover lid and a chamber. The cover lid covers the chamber and the reaction space is formed between the cover lid and the chamber. The extension line has an outlet facing the cover lid, and the non-reactive gas output from the outlet is used to blow the powders around in the reaction space.

Preferably, the air intake line transports a precursor to the reaction space.

Preferably, the inner tube extends from the accommodating space of the outer tube into the reaction space of the vacuum chamber and forming a protruding tube part in the reaction space.

Preferably, the extension line passes through the protruding tube part of the inner tube and extends in a direction toward the abutment side of the reaction space.

Preferably, the powder atomic layer deposition apparatus further includes a filter unit disposed in one end of the inner tube connecting to the reaction space. The air extraction line is fluidly connected to the reaction space via the filter unit. The extension line passes through the filter unit and extends in a direction toward the abutment side of the reaction space.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
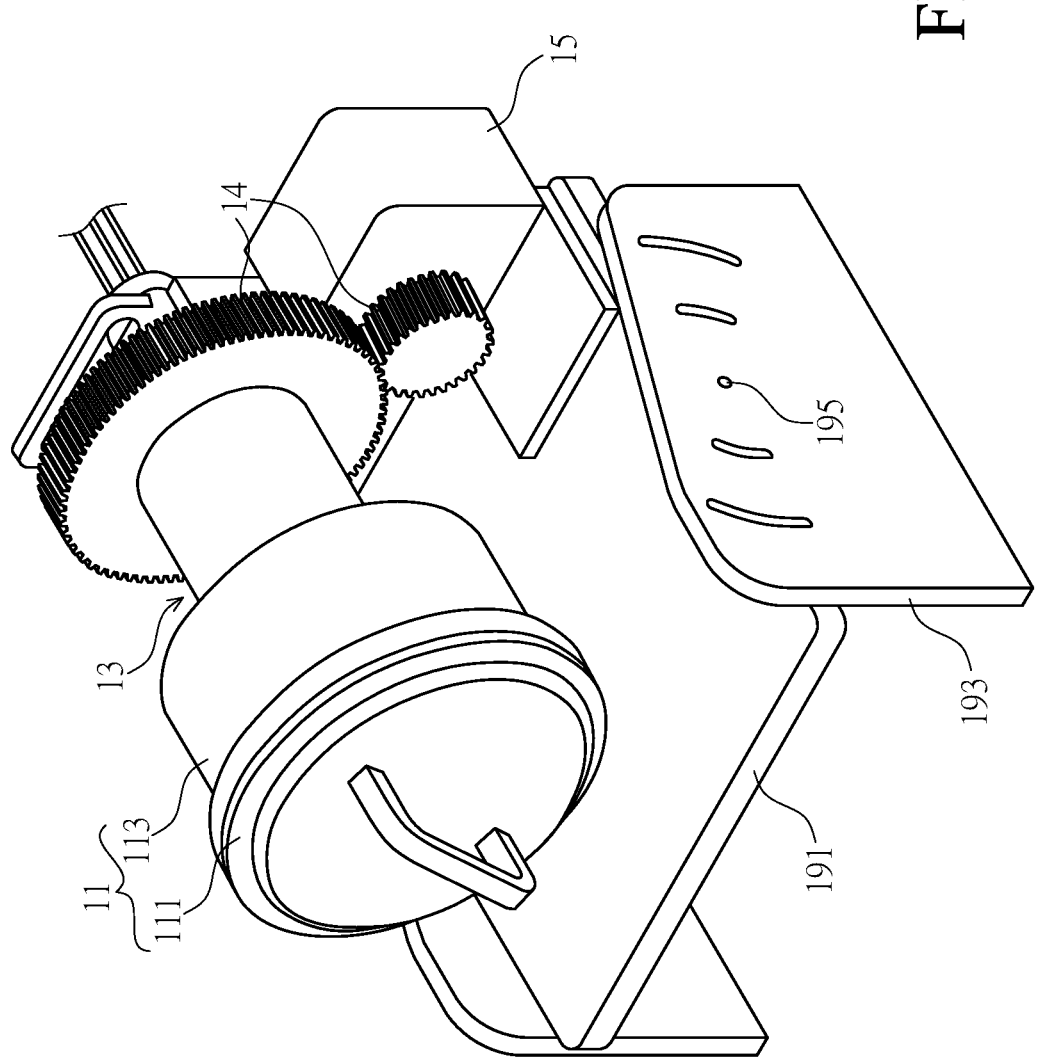
FIG. 1 is a schematic diagram of a powder atomic layer deposition apparatus for blowing powders according to an embodiment of the present disclosure.
Figure 2:
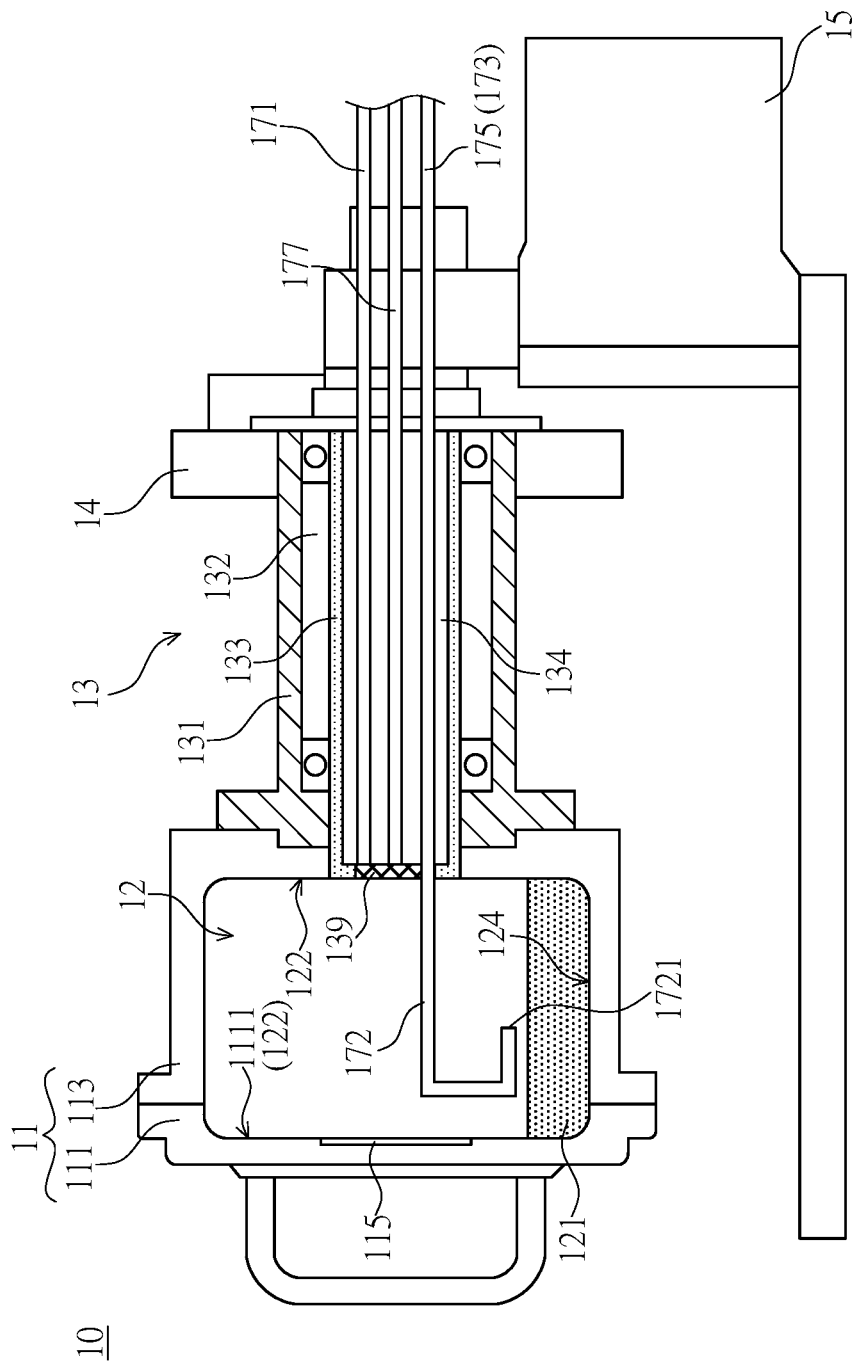
FIG. 2 is a cross-sectional schematic diagram of a powder atomic layer deposition apparatus for blowing powders according to an embodiment of the present disclosure.
Figure 3:
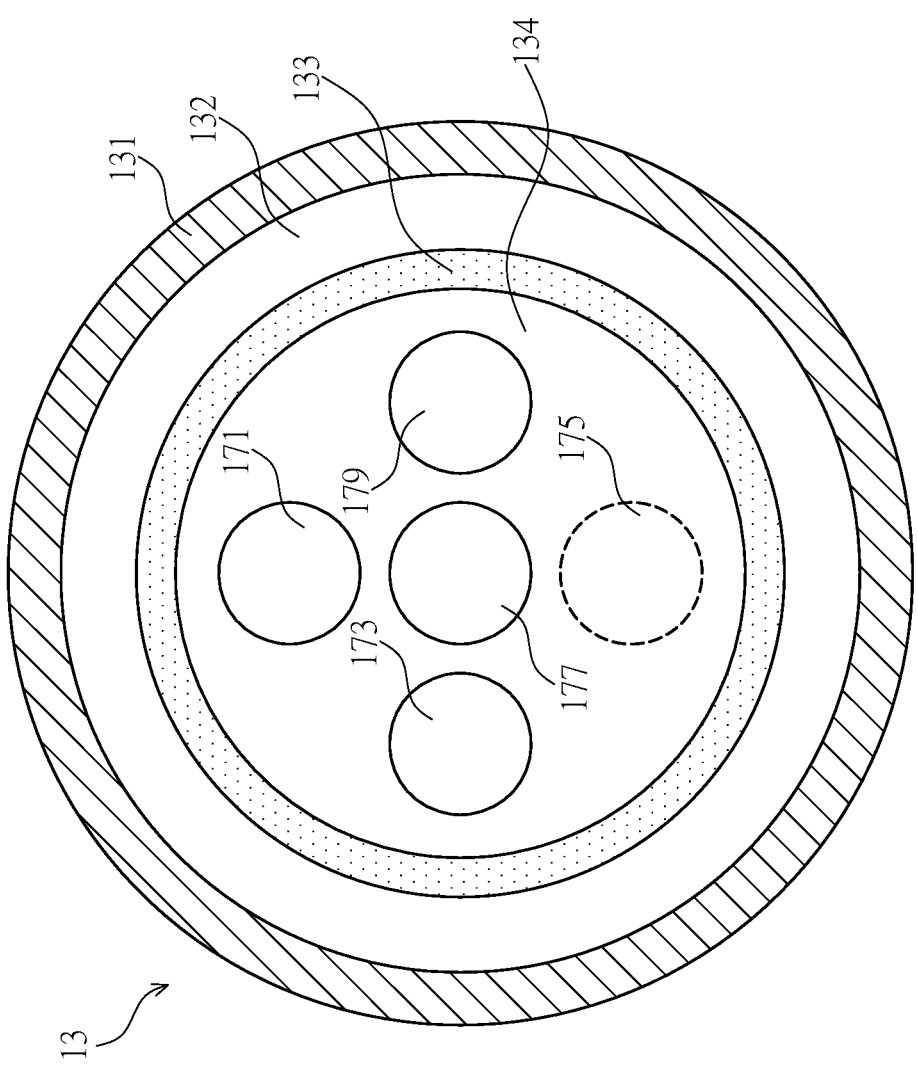
FIG. 3 is a cross-sectional schematic diagram illustrating a shaft sealing device of a powder atomic layer deposition apparatus for blowing powders according to an embodiment of the present disclosure.

Referring to FIG. 1, FIG. 2, and FIG. 3, an powder atomic layer deposition apparatus 10 for blowing powders includes a vacuum chamber 11, a shaft sealing device 13, and a driving unit 15. As shown in the figures, the driving unit 15 is connected to the vacuum chamber 11 via the shaft sealing device 13 and in turn drives the vacuum chamber 11 to rotate.

The vacuum chamber 11 has a reaction space 12 for accommodating a plurality of powders 121 such as quantum dots. The quantum dots may be made of semiconductor material like ZnS, CdS, CdSe, etc in groups II~VI, and a thin film formed on each of the quantum dots may be aluminum oxide ($Al_2O_3$). The vacuum chamber 11 includes a cover lid 111 and a chamber 113, wherein an inner surface 1111 of the cover lid 111 is used to cover the chamber 113 so as to form the reaction space 12 between the cover lid 111 and the chamber 113.

In one embodiment, a monitor wafer 115 is disposed on the inner surface 1111 of the cover lid 111, wherein the monitor wafer 115 is positioned inside the reaction space 12 when the cover lid 111 covers the chamber 113. During the ALD process in the reaction space 12, a thin film is formed on the surface of the monitor wafer 115. In practice, the thickness of the thin film formed on the surface of the monitor wafer 115 and the thickness of the thin film formed on the surface of the powder 121 can be measured to calculate a relation between the two thin films. Subsequently, the thickness of the thin film formed on the surface of the powder 121 can be obtained by measuring the thickness of the thin film formed on the surface of the monitor wafer 115 and converting the measured thickness based on the relation.

The shaft sealing device 13 includes an outer tube 131 and an inner tube 133, wherein the outer tube 131 has an accommodating space 132 and the inner tube 133 has a connection space 134. The outer tube 131 and the inner tube 133 may, for example, be hollow columnar objects. The accommodating space 132 of the outer tube 131 is used to accommodate the inner tube 133, and the outer tube 131 and the inner tube 133 are configured to be coaxial. The shaft sealing device 13 can be a common shaft seal or a magnetic fluid shaft seal that is mainly used for isolating the reaction space 12 of the vacuum chamber 11 from outer spaces to maintain vacuum in the reaction space 12.

The driving unit 15 is connected to one end of the shaft sealing device 13 and drives the vacuum chamber 11 to rotate through the shaft sealing device 13. The driving unit may, for example, be connected to the vacuum chamber 11 via the outer tube 131, and through the outer tube 131, drives the vacuum chamber 11 to rotate. The driving unit 15 is not connected to the inner tube 133, therefore when the driving unit 15 drives the outer tube 131 and the vacuum chamber 11 to rotate, the inner tube 133 does not rotate along therewith.

The driving unit 15 may drive the outer tube 131 and the vacuum chamber 11 to rotate continuously in one direction or in the same direction, like clockwise or counterclockwise. In different embodiments, the driving unit 15 may drive the outer tube 131 and the vacuum chamber 11 to rotate in the clockwise direction by a specific angle, and then in the counterclockwise direction by the specific angle; the angle is, for example, 360 degrees. As the vacuum chamber 11 rotates, the powders 121 in the reaction space 12 are stirred and agitated, which in turn facilitates the powders 121 to be heated evenly and to come in contact with a precursor gas or a non-reactive gas.

In one embodiment, the driving unit 15 is a motor, which is connected to the outer tube 131 via a gear 14, and through the gear 14, drives the outer tube 131 and the vacuum chamber 11 to rotate.

As shown in FIG. 2 and FIG. 3, at least one air extraction line 171, at least one air intake line 173, at least one non-reactive gas line 175, a heater 177 and/or a temperature sensing unit 179 are disposed in the connection space 134 of the inner tube 133.

The air extraction line 171 is fluidly connected to the reaction space 12 of the vacuum chamber 11 and is used to extract gas from the reaction space 12 to create vacuum in the reaction space 12 for subsequent ALD process. In particular, the air extraction line 171 can connect to a pump and use the pump to extract the gas in the reaction space 12.

The air intake line 173 is fluidly connected to the reaction space 12 of the vacuum chamber 11 and is used to transport a precursor or a non-reactive gas to the reaction space 12, wherein the non-reactive gas may be a noble gas like nitrogen or argon. The air intake line 173 can, for example, be connected to a precursor storage tank and a non-reactive gas storage tank via a valve set, and through the valve set, transport the precursor to the reaction space 12 for the precursor to be deposited on the surface of each powder 121. In practical application, the air intake line 173 may transport a carrier gas together with the precursor to the reaction space 12. Then, the air intake line 173 transports the non-reactive gas to the reaction space 12 through the valve set in addition to the air extraction line 171 extracting gas from the reaction space 12, to remove the precursor in the reaction space 12. In one embodiment, the air intake line 173 is connected to a plurality of branch lines and transports different precursors to the reaction space 12 sequentially through the respective branch lines.

The air intake line 173 is also capable of increasing a flow of non-reactive gas delivered to the reaction space 12, so as to blow the powders 121 around in the reaction space 12 by the non-reactive gas, such that the powders 121 are carried by the non-reactive gas and diffused to various areas and all regions of the reaction space 12.

In one embodiment, the air intake line 173 includes the at least one non-reactive gas line 175, wherein the non-reactive gas line 175 is fluidly connected to the reaction space 12 of the vacuum chamber 11 and is used to transport a non-reactive gas to the reaction space 12. The non-reactive gas line 175 can, for example, be connected to a nitrogen storage tank via a valve set, and through the valve set, transport nitrogen to the reaction space 12. The non-reactive gas is used to blow the powders 121 around in the reaction space 12, and in combination with the rotating of the vacuum chamber 11 driven by the driving unit 15, the powders 121 in the reaction space 12 are effectively and evenly stirred and agitated, thereby contributing in forming a thin film with a uniform thickness on the surface of each powder 121.

The air intake line 173 and the non-reactive gas line 175 of the powder atomic layer deposition apparatus 10 for blowing powders are both used to transport non-reactive gas to the reaction space 12. The flow of non-reactive gas transported by the air intake line 173 is smaller as the main purpose of which is for removing the precursor in the reaction space 12, whereas the flow of non-reactive gas transported by the non-reactive gas line 175 is larger and is mainly used to blow the powders 121 around in the reaction space 12.

More specifically, the timings at which the air intake line 173 and the non-reactive gas line 175 transport the non-reactive gas to the reaction space 12 are different. Hence, the non-reactive gas line 175 may be omitted in practical application, and instead, the flow of non-reactive gas transported by the air intake line 173 at different timings is adjusted. When removing the precursor from the reaction space 12, the flow of non-reactive gas being transported to the reaction space 12 by the air intake line 173 is lowered, and when blowing the powders 121 around in the reaction space 12, the flow of non-reactive gas being transported to the reactions space 12 by the air intake line 173 is enlarged.

When the driving unit 15 drives the outer tube 131 and the vacuum chamber 11 to rotate, the inner tube 133 and the air extraction line 171, the air intake line 173 and/or the non-reactive gas line 175 disposed in the inner tube 133 do not rotate along therewith, which in turn keeps a stable supply of non-reactive gas and/or precursor to the reaction space 12 by the air intake line 173 and/or the non-reactive gas line 175.

Figure 5:
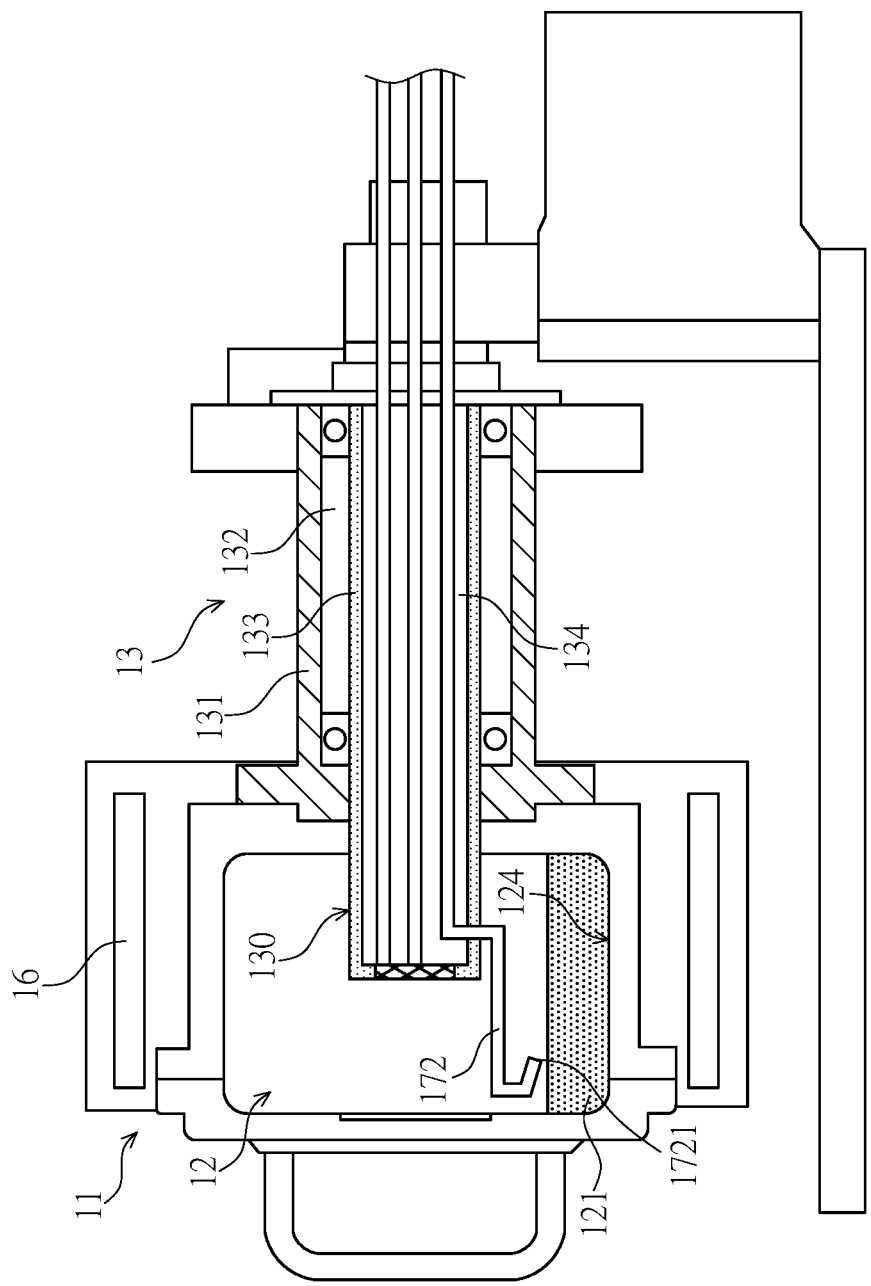
FIG. 5 is a cross-sectional schematic diagram of a powder atomic layer deposition apparatus for blowing powders according to another embodiment of the present disclosure.

The heater 177 is used to heat the connection space 134 and the inner tube 133. By heating the air extraction line 171, the air intake line 173 and/or the non-reactive gas line 175 in the inner tube 133 with the heater 177, temperatures of the gases in the air extraction line 171, the air intake line 173 and/or the non-reactive gas line 175 are raised. For example, the temperature of non-reactive gas and/or precursor transported by the air intake line 173 to the reaction space 12 may be raised, and the temperature of non-reactive gas transported by the non-reactive gas line 175 to the reaction space 12 may be raised. As such, when the non-reactive gas and/or the precursor enter the reaction space 12, the temperature of the reaction space 12 would not drop or change drastically. Moreover, the temperature sensing unit 179 is used to measure the temperature of the heater 177 or the connection space 134 to monitor an operation status of the heater 177. Additional heating device 15 is also often disposed inside of, outside of, or as shown in FIG. 5, surrounding the vacuum chamber 11, wherein the heating device 16 is adjacent to or in contact with the vacuum chamber 11 for heating the vacuum chamber 11 and the reaction space 12.

In one embodiment, the air intake line 173 and/or the non-reactive gas line 175 extend from the inner tube 133 of the shaft sealing device 13 into the reaction space 12 of the vacuum chamber 11 in a direction toward a surface of the reaction space 12. The air intake line 173 and/or the non-reactive gas line 175 extend, for example, from the connection space 134 of the inner tube 133 into the reaction space 12 of the vacuum chamber, and the part of the air intake line 173 and/or the non-reactive gas line 175 that extends into the reaction space 12 is defined as an extension line 172.

In one embodiment, the reaction space 12 has a columnar shape and includes two bottom sides 122 and at least one abutment side 124, wherein the abutment side 124 is connected to the two bottom sides 122. The air intake line 173, the non-reactive gas line 175 and/or the extension line 172 in the reaction space 12 extend toward the abutment side 124 of the reaction space 12, such as extending toward the abutment side 124 at the lower half of the reaction space 12.

The extension line 172 includes an outlet 1721 that faces the shaft sealing device 13, and the non-reactive gas is blown or output through the outlet 1721 by the extension line 172 toward a direction of the shaft sealing device 13 to blow the powders 121 around. As shown in FIG. 2, a part of the extension line 172 in one embodiment of the present disclosure appears to be U-shape and has three sections and two turning angles, wherein the turning angle is around 90 degrees. A first section of the extension line 172 is connected to the air intake line 173 and/or the non-reactive gas line 175 in the inner tube 133 and extends in a direction toward the cover lid 111 or the bottom side 122 of the reaction space. A second section of the extension line 172 is connected to the first section and extends in a direction toward the abutment side 124 of the reaction space 12, and there is a turning angle between the first section and the second section. A third section of the extension line 172 is connected to the second section and extends in a direction toward the other bottom side 122 of the reaction space 12 or the shaft sealing device 13. And there is a turning angle between the second section and the third section.

Figure 6:
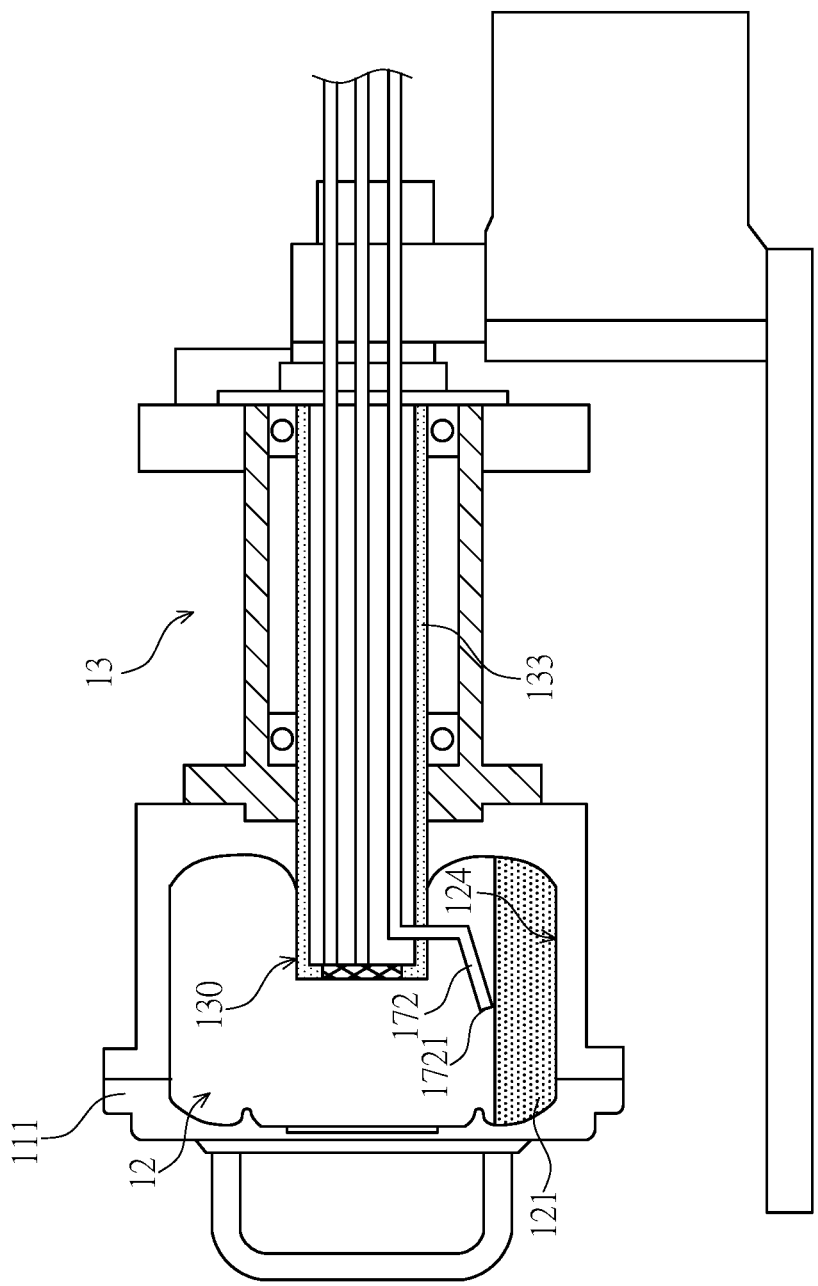
FIG. 6 is a cross-sectional schematic diagram of a powder atomic layer deposition apparatus for blowing powders according to another embodiment of the present disclosure.

In different embodiments, the turning angle between the second section and the third section may be greater than 90 degrees, such that there is an included angle between a line of extension of the outlet 1721 and the abutment side 124 of the reaction space 12. Thus, the outlet 1721 outputs the non-reactive gas downwardly in a slanted manner to blow powders 121 around in the reaction space 12 as shown in FIG. 5 and FIG. 6. The outlet 1721 shown in FIG. 5 faces a direction of the shaft sealing device 13 and the outlet 1721 shown in FIG. 6 faces a direction of the cover lid 111.

In one embodiment, the extension line 172 may be straight. For example, the extension line 172 may only has one section that extends in a direction from the shaft sealing device 13 toward the cover lid 111, so as to shorten a distance between the outlet 1721 of the extension line 172 and the cover lid 111. Or, the extension line 172 may be curved, and the turning angle is rounded. In other embodiments, the extension line 172 includes four sections and three turning angles as shown in FIG. 5, or includes two sections and one turning angle as shown in FIG. 6. In specific, nor the number of sections and turning angles of the extension line 172, or the degree/extent of turning angles of the extension line 172, are limitations to the claim scope of the present disclosure.

In general, a filter unit 139 is disposed at one end of the inner tube 133 that is connected to the reaction space 12. The air extraction line 171, the air intake line 173 and/or the non-reactive gas line 17 in the inner tube 133 are fluidly connected to the reaction space 12 of the vacuum chamber 11 via the filter unit 139.

With the placement of the filter unit 139, the powders 121 in the reaction space 12 are prevented from being extracted out of the reaction space 12 when gas is being extracted from the reaction space 12 by the air extraction line 171 and leaving the reaction space 12 through the air intake line 173 and/or the non-reactive gas line 175, and thus a loss of powders is saved.

Figure 4:
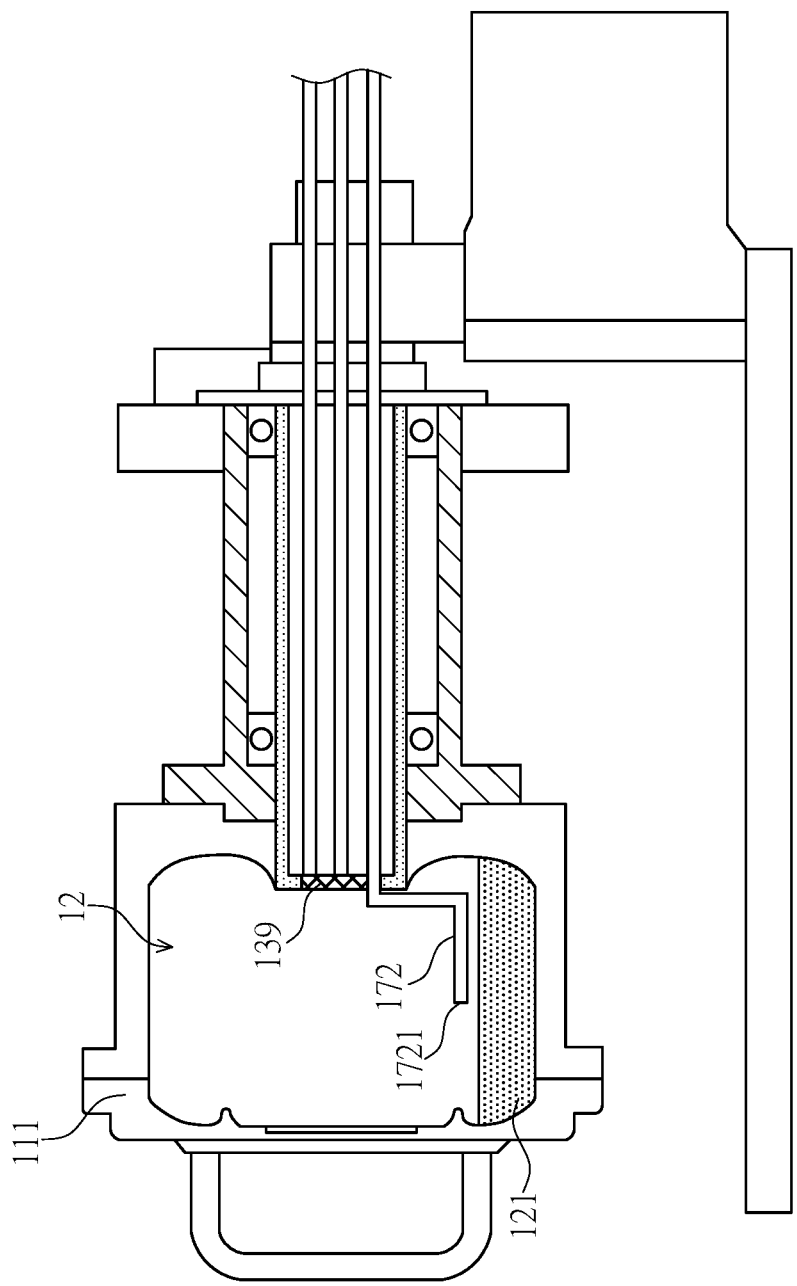
FIG. 4 is a cross-sectional schematic diagram of a powder atomic layer deposition apparatus for blowing powders according to another embodiment of the present disclosure.

In one embodiment, the extension line 172 passes through the filter unit 139 and extends to the reaction space 12, wherein the outlet 1721 of the extension line 172 faces the shaft sealing device 13, as shown in FIG. 2. In another embodiment as shown in FIG. 4, the extension line 172 passes through the filter unit 139 and extends to the reaction space 12, wherein the outlet 1721 of the extension line 172 faces the cover lid 111.

In one embodiment, the inner tube 133 of the shaft sealing device 13 extends from the accommodating space 132 of the outer tube 131 to the reaction space 12 of the vacuum chamber 11 and the inner tube 133 forms a protruding tube part 130 in the reaction space 12. The extension line 172 passes through the protruding tube part 130 of the inner tube 133 and extends in a direction toward the abutment side 124 of the reaction space 12, wherein the outlet 1721 of the extension line 172 faces the shaft sealing device 13 or the cover lid 111, as shown in FIG. 5 or FIG. 6.

In practical application, the height of the outlet 1721 of the extension line 172 may be adjusted or the amount of powder 121 in the reaction space 121 may be controlled, to ensure that the powders 121 in the reaction space 12 does not cover the outlet 1721 of the extension line 172 when the vacuum chamber 11 is stationary and not in motion, so a loss of powders 121 can be reduced. In addition, another filter unit can be disposed at the outlet 1721 of the extension line 172 to further reduce the loss of powders 121.

In other embodiments, the extension line 172 transports the non-reactive gas to the reaction space 12 continuously and adjusts a flow of non-reactive gas. More specifically, the extension line 172 outputs the non-reactive gas in different modes which include a stirring mode and a normal mode. In the stirring mode, the flow of non-reactive gas output by the extension line 172 is greater and the output non-reactive gas stirs and agitates the powders 121 in the reaction space 12. In the normal mode, the flow of non-reactive gas output by the extension line 172 is smaller. Although the output non-reactive gas in the normal mode may not be able to stir the powders in the reaction space 12, it forms a positive pressure at the outlet 1721 of the extension line 172, which in turn prevents the powders 121 from entering the extension line 172 through the outlet 1721.

Figure 7:
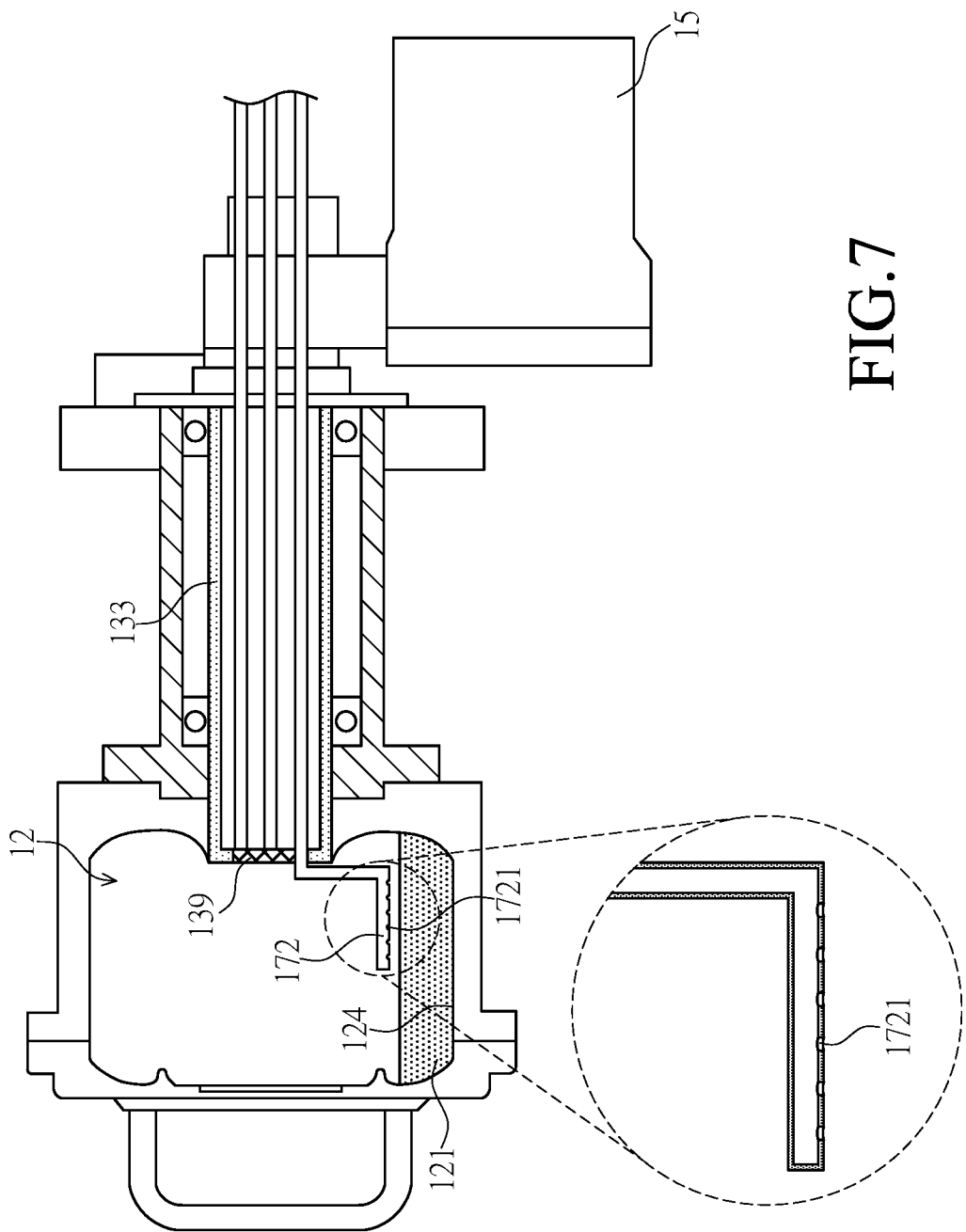
FIG. 7 is a cross-sectional schematic diagram of a powder atomic layer deposition apparatus for blowing powders according to another embodiment of the present disclosure.

In another embodiment as shown in FIG. 7, the extension line 172 passes through the filter unit 139 disposed in the inner tube 133, and the extension line 172 has a plurality of outlets 1721. The plurality of outlets 1721 are located on a side wall of the extension line 172 and face an abutment side 124 of the reaction space 12, like facing the abutment side 124 at lower half of the reaction space 12. Through the plurality of outlets 1721, the extension line 172 transports the non-reactive gas to flow toward the abutment side 124 of the reaction space 12 so as to blow the powders 121 around in the reaction space 12 by the non-reactive gas.

In one embodiment, the powder atomic layer deposition apparatus 10 for blowing powders further includes a support base 191 and at least one mount bracket 193, wherein the support base 191 is a board body for placing the driving unit 15, the vacuum chamber 11, and the shaft sealing device 13 thereon. The support base 191 is connected to the driving unit 15, and is connected to the shaft sealing device 13 and the vacuum chamber 11 via the driving unit 15. The shaft sealing device 13 and/or the vacuum chamber 11 can also be connected to the support base 191 via at least one support member so as to enhance the stability of connection.

The support base 191 is connected to the mount bracket 193 via at least one connecting shaft 195, wherein the number of mount brackets 193 is two and the two mount brackets 193 are respectively disposed at two sides of the support base 191. The support base 191 is rotatable relative to the mount brackets 193 with the connecting shaft 195 as axis, so as to change an inclination angle of the driving unit 15, the shaft sealing device 13, and the vacuum chamber 11, and in turn assist in the formation of a thin film with a uniform thickness on the surface of each powder 121.

Figure 8:
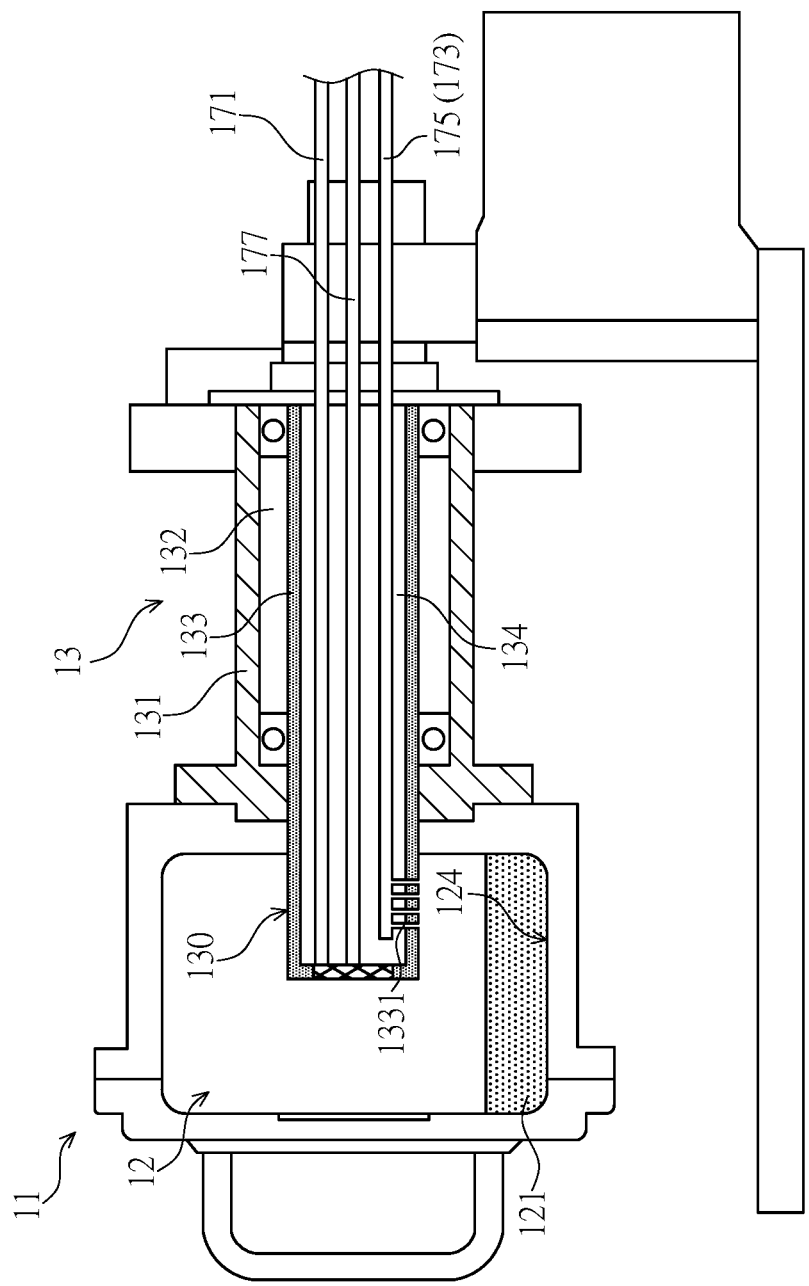
FIG. 8 is a cross-sectional schematic diagram of a powder atomic layer deposition apparatus for blowing powders according to another embodiment of the present disclosure.

In another embodiment as shown in FIG. 8, the air intake line 173 and/or the non-reactive gas line 175 do not extend from the reaction space 134 of the inner tube into the reaction space. In other words, there is no extension line 172 in the reaction space 12 of the vacuum chamber 11. Rather, a plurality of outlets 1331 are disposed on the tube wall of the inner tube 133 and/or the protruding tube part 130 that is close to the lower half of the vacuum chamber, wherein the outlets 1331 pass through the tube wall of the protruding tube part 130 and face a surface of the lower half or the abutment side 124 of the reaction space.

The air extraction line 171, the air intake line 173, the non-reactive gas line 175, the heater 177 and/or the temperature sensing unit 179 extend into the protruding tube part 130, wherein the air intake line 173 and/or the non-reactive gas line 175 are fluidly connected to the outlets 1331 on the tube wall of the inner tube 133 or the protruding tube part 130. In specific, the outlets 1331 disposed on the tube wall of the protruding tube part 130 or the inner tube 133 face the abutment side 124 at the lower half of the reaction space 12, so that the air intake line 173 or the non-reactive gas line 175 can transport and direct the non-reactive gas to flow through the outlets 1331 and toward the abutment side 124 at the lower half of the reaction space 12 and to blow the powders 121 around in the reaction space 12. In one embodiment, the air intake line 173 or the non-reactive gas line 175 are integrated to the inner surface of the inner tube 133 and connected to the outlets 1331 disposed on the inner tube 133.

Figure 9:
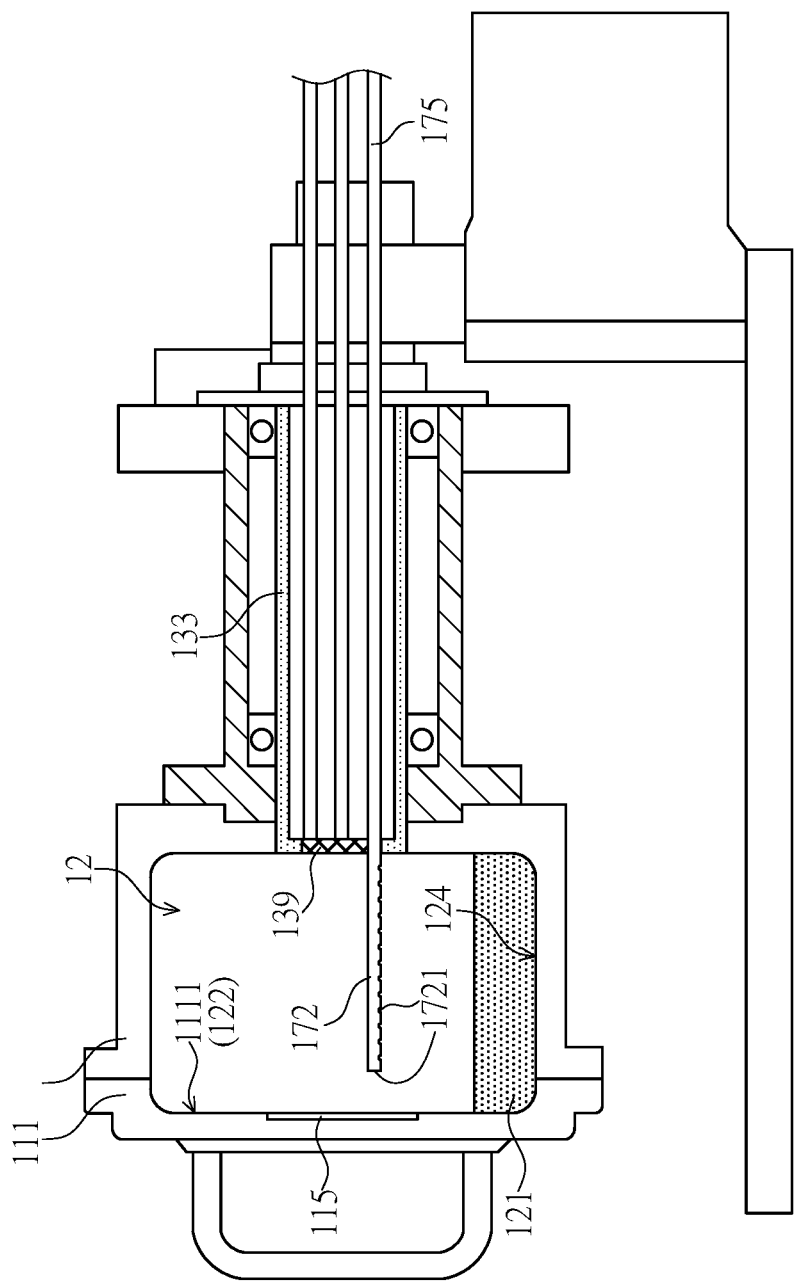
FIG. 9 is a cross-sectional schematic diagram of a powder atomic layer deposition apparatus for blowing powders according to another embodiment of the present disclosure.

In another embodiment shown in FIG. 9, the extension line 172 passes through the filter unit 139 disposed in the inner tube 133 and extends toward the cover lid 111, wherein the extension line 172 does not have any bending portion and has one or a plurality of outlets 1721. The plurality of outlets 1721 are located on a side wall of the extension line 172 and face an abutment side 124 of the reaction space 12, like facing the abutment side 124 at lower half of the reaction space 12. Through the plurality of outlets 1721, the extension line 172 transports the non-reactive gas to flow toward the abutment side 124 of the reaction space 12 so as to blow the powders 121 around in the reaction space 12 by the non-reactive gas. In practice, the outlets 1721 may be configured to face the upper half of the reaction space 12 or the right or left side of the reaction space 12.

In different embodiments, the outlets 1721 of the extension line 172 face the cover lid 111 and/or the monitor wafer 115 on the cover lid 111. Through the outlets 1721 of the extension line 172, the non-reactive gas is blown toward the bottom side 122 of the reaction space 12 and/or the monitor wafer 115.

Furthermore, the extension line 172 and the non-reactive gas line 175 can be two separate lines, and the extension line 172 can be fixed to the non-reactive gas line 175 by screw and is detachable from the non-reactive gas line 715.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

The invention claimed is:

1. A powder atomic layer deposition apparatus for blowing powders, comprising:
    a vacuum chamber, comprising a reaction space for accommodating a plurality of powders;
    a shaft sealing device, comprising an outer tube connected to the vacuum chamber and an inner tube; wherein the outer tube has an accommodating space the accommodating space accommodate the inner tube and the inner tube has a connection space communicating the reaction space;
    a driving unit, connected to the vacuum chamber via the outer tube of the shaft sealing device, wherein the driving unit drives the vacuum chamber to rotate through the outer tube of the shaft sealing device, and the driver unit is not connected to the inner tube; wherein when the driving unit drives the outer tube and the vacuum chamber to rotate, the inner tube does not rotate with the outer tube and the vacuum chamber;
    at least one air extraction line, disposed in the connection space of the inner tube and fluidly connected to the reaction space of the vacuum chamber, for extracting a gas from the reaction space; and
    at least one air intake line, disposed in the connection space of the inner tube and extending from the inner tube into the reaction space toward a surface of the reaction space, for transporting a non-reactive gas to the reaction space, wherein the non-reactive gas blows the powders around in the reaction space.

2. The powder atomic layer deposition apparatus of claim 1, wherein the reaction space comprises two bottom sides and at least one abutment side connected to the two bottom sides, and the air intake line extends in a direction toward the abutment side or one of the bottom sides of the reaction space.

3. The powder atomic layer deposition apparatus of claim 2, wherein the air intake line comprises at least one non-reactive gas line extending from the inner tube into the reaction space and toward the abutment side or one of the bottom sides of the reaction space, for transporting the non-reactive gas to the reaction space to blow the powders around in the reaction space.

4. The powder atomic layer deposition apparatus of claim 3, wherein the non-reactive gas line comprises an extension line, the extension line is disposed in the reaction space and extends in a direction toward the abutment side or one of the bottom sides of the reaction space.

5. The powder atomic layer deposition apparatus of claim 4, wherein the vacuum chamber comprises a cover lid and a chamber, the cover lid covers the chamber to form the reaction space between the cover lid and the chamber, and the extension line comprises an outlet facing toward the cover lid and outputs the non-reactive gas through the outlet to blow the powders around in the reaction space.

6. The powder atomic layer deposition apparatus of claim 1, wherein the air intake line transports a precursor to the reaction space.

7. The powder atomic layer deposition apparatus of claim 4, wherein the inner tube extends from the accommodating space of the outer tube into the reaction space of the vacuum chamber and forms a protruding tube part in the reaction space.

8. The powder atomic layer deposition apparatus of claim 4, further comprising a filter unit disposed at one end of the inner tube connecting to the reaction space, wherein the air extraction line is fluidly connected to the reaction space via the filter unit, and the extension line passes through the filter unit and extends in a direction toward the abutment side or one of the bottom sides of the reaction space.

9. The powder atomic layer deposition apparatus of claim 8, wherein the extension line comprises a plurality of outlets disposed on a side wall of the extension line and facing an abutment side of the reaction space, and a non-reactive gas is transported by the extension line and flows toward the abutment side of the reaction space through the plurality of outlets to blow the powders around in the reaction space.

10. The powder atomic layer deposition apparatus of claim 9, wherein the plurality of outlets on the extension line face the abutment side at lower half of the reaction space.

\* \* \* \* \*